United States Patent
Cheng et al.

(10) Patent No.: US 7,026,195 B2
(45) Date of Patent: Apr. 11, 2006

(54) PLANARIZING METHOD FOR FORMING FIN-FET DEVICE

(75) Inventors: Chung-Long Cheng, Hsin-Chu (TW); Kong-Beng Thei, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/851,376

(22) Filed: May 21, 2004

(65) Prior Publication Data

US 2005/0258476 A1 Nov. 24, 2005

(51) Int. Cl.
*H01L 21/00* (2006.01)
*H01L 21/302* (2006.01)

(52) U.S. Cl. ................. 438/149; 438/156; 438/706
(58) Field of Classification Search ........ 438/149–150, 438/156–159, 706
See application file for complete search history.

(56) References Cited

U.S. PATENT DOCUMENTS 6,525,403 B1 *  2/2003  Inaba et al. ................. 257/329
6,855,989 B1 *  2/2005  Wang et al. ................ 438/149

* cited by examiner

*Primary Examiner*—Cuong Nguyen
(74) *Attorney, Agent, or Firm*—Tung & Assoc

(57) ABSTRACT

A method for forming a FIN-FET device employs a blanket planarizing layer formed upon a blanket topographic gate electrode material layer. The blanket planarizing layer is patterned and employed as a mask layer for patterning the blanket topographic gate electrode material layer to form a gate electrode. Since the blanket planarizing layer is formed as a planarizing layer, a photoresist layer formed thereupon is formed with enhanced resolution. As a result, the gate electrode is also formed with enhanced resolution. A resulting FIN-FET structure has the patterned planarizing layer formed in an inverted "U" shape upon the gate electrode.

20 Claims, 2 Drawing Sheets

PLANARIZING METHOD FOR FORMING FIN-FET DEVICE

BACKGROUND OF THE INVENTION

1. Field of the Invention

The invention relates generally to methods for fabricating FIN-FET devices. More particularly, the invention relates to methods for fabricating FIN-FET devices with enhanced performance.

2. Description of the Related Art

Field effect transistor devices are common elements within semiconductor products. They are typically formed within a semiconductor substrate. They include a gate electrode separated from the semiconductor substrate by a gate dielectric layer. A channel region of the semiconductor substrate is defined beneath the gate electrode. The channel region separates a pair of source/drain regions.

As semiconductor device dimensions have decreased, it has become more difficult to fabricate field effect transistor devices with enhanced performance. The difficulties derive from channel effects that in turn result from forming gate electrodes with reduced linewidths within semiconductor products. These channel effects are also known as short channel effects.

In an effort to minimize short channel effects within semiconductor products, the design and fabrication of FIN-FET devices has evolved. In contrast with conventional field effect transistor devices, FIN-FET devices employ an insulator substrate or an insulator substrate layer that may in turn be formed upon a semiconductor substrate. In turn, a patterned silicon fin layer is formed upon the insulator substrate or insulator substrate layer. The patterned silicon fin layer terminates in a pair of source/drain regions formed at opposite ends of the fin. A three-dimensional channel region of the fin spans between the source and drain regions. Next, a gate dielectric layer is formed upon the three-dimensional channel region. In turn a polysilicon layer is formed and patterned as a gate electrode layer that perpendicularly traverses the fin at the three dimensional channel region. Thus, the FIN-FET device has a three-dimensional gate electrode in turn formed upon a three-dimensional fin channel.

Although FIN-FET devices address many short channel effect problems of conventional field effect transistor devices, they are nonetheless not entirely without problems.

In particular, FIN-FET devices suffer from photolithographic resolution difficulties in their fabrication since they provide for forming one three dimensional layer (i.e., a gate electrode layer) upon another three-dimensional layer (i.e., a polysilicon fin layer). The difficulties become particularly pronounced since the patterned silicon fin layer is often formed of enhanced step height such as to maximize channel width properties within a FIN-FET device. It is thus desirable to provide methods for forming FIN-FET devices with enhanced resolution. The present invention is directed towards the foregoing object.

SUMMARY OF THE INVENTION

A first object of the invention is to provide a method for forming a FIN-FET device.

A second object of the invention is to provide a method in accord with the first object of the invention, where the FIN-FET device is fabricated with enhanced resolution.

In accord with the objects of the invention, the invention provides a method for fabricating a FIN-FET device.

In accord with the invention, the method in general provides for forming a FIN-FET device in accord with conventional processing procedures. In particular, a patterned silicon source/drain and channel fin layer is formed upon an insulator substrate. A gate dielectric layer and a blanket conformal topographic gate electrode material layer are successively layered upon a channel region of the fin layer. A blanket planarizing layer is formed upon the blanket conformal topographic gate electrode material layer. The blanket planarizing layer is patterned to form a patterned planarizing layer that in turn is employed as a mask for forming a gate electrode from the blanket conformal topographic gate electrode material layer.

The invention provides a method for forming a FIN-FET device with enhanced resolution.

The invention realizes the foregoing object by employing a blanket planarizing layer that is patterned to form a patterned planarizing layer as a mask, when forming a gate electrode from a blanket conformal topographic gate electrode material layer. By providing the blanket planarizing layer as a planarizing layer, the same may be patterned with enhanced resolution to provide the patterned planarizing layer. Thus, in turn the gate electrode may be patterned from the blanket gate electrode material layer with enhanced resolution.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, that form a material part of this disclosure, wherein.

DESCRIPTION OF THE PREFERRED EMBODIMENT

The invention provides a method for forming a FIN-FET device with enhanced resolution.

The invention realizes the foregoing object by employing a blanket planarizing layer that is patterned to form a patterned planarizing layer as a mask, when forming a gate electrode from a blanket conformal topographic gate electrode material layer. By providing the blanket planarizing layer as a planarizing layer, the same may be patterned with enhanced resolution to provide the patterned planarizing layer. Thus, in turn the gate electrode may be patterned from the blanket conformal topographic gate electrode material layer with enhanced resolution.

FIG. 1 to FIG. 7 show a series of schematic plan-view and cross-sectional diagrams illustrating the results of progressive stages in fabricating a FIN-FET device in accord with a preferred embodiment of the invention.

Figure 1:
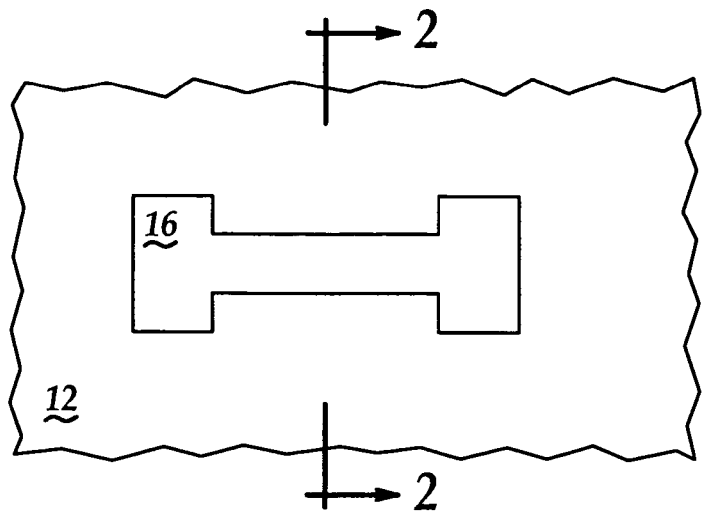
FIG. 1 shows a schematic plan-view diagram of a FIN-FET device at an early stage in its fabrication in accord with the preferred embodiment of the invention.

FIG. 1 shows a schematic plan-view diagram of the FIN-FET device at an early stage in its fabrication.

FIG. 1 shows an insulator layer 12. A gate dielectric layer 16 is formed upon a patterned silicon (monocrystal) source/drain and channel fin layer formed upon the insulator layer 12.

The insulator layer 12 may be formed from any of several insulator materials, including but not limited to silicon oxide, silicon nitride and silicon oxynitride insulator materials. Typically, the insulator layer 12 is formed to a thickness of from about 2000 to about 10000 angstroms. The patterned silicon source/drain and channel fin layer may be patterned from a blanket monocrystalline silicon layer as is otherwise conventional in the semiconductor product fabrication art. Typically, the patterned silicon source/drain and channel fin layer is formed to a thickness of from about 500 to about 5000 angstroms, and with lateral dimensions of from about 0.1 to about 1.0 microns. The gate dielectric layer 16 is typically formed of a silicon oxide dielectric material formed to a thickness of from about 10 to about 100 angstroms.

Figure 2:
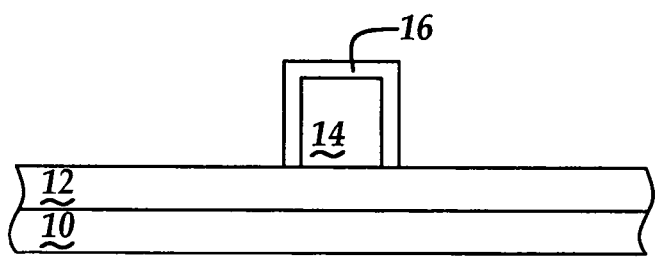
FIG. 2 to FIG. 6 show a series of schematic cross-sectional diagrams illustrating the results of progressive stages in fabricating a FIN-FET device in accord with a preferred embodiment of the invention.

FIG. 2 shows a schematic cross-sectional diagram corresponding with the schematic plan-view diagram of FIG. 1.

FIG. 2 shows a substrate 10. The insulator layer 12 is formed upon the substrate 10. The patterned silicon source/drain and channel fin layer 14 is formed upon the insulator layer 12. The gate dielectric layer 16 is formed upon the patterned silicon source/drain and channel fin layer 14.

The substrate 10 may include, but is not limited to any of several types of substrates employed within semiconductor fabrication. Such substrates may include, but are not limited to conductor substrates, semiconductor substrates and insulator substrates. More typically, the invention employs a silicon-on-insulator semiconductor substrate that provides: (1) the substrate 10 as a semiconductor substrate; (2) the insulator layer 12 originally as a buried insulator layer; and (3) a silicon surface layer that may be patterned to form the patterned silicon source/drain and channel fin layer 14.

Figure 3:
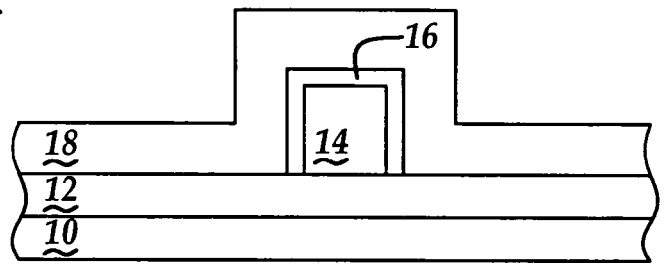

FIG. 3 shows the results of further processing of the semiconductor product of FIG. 2. FIG. 3 shows a blanket conformal topographic gate electrode material layer 18 formed upon exposed portions of the insulator layer 12 and the gate dielectric layer 16.

The blanket conformal topographic gate electrode material layer 18 may be formed of gate electrode materials as are otherwise conventional in the semiconductor product fabrication art. Such gate electrode materials may include, but are not limited to polysilicon gate electrode materials and polycide gate electrode materials. Typically, the blanket conformal topographic gate electrode material layer 18 is formed of a doped polysilicon (i.e., 1E18–1E22 dopant atoms per cubic centimeter) material formed to a thickness of from about 1000 to about 10000 angstroms.

Figure 4:
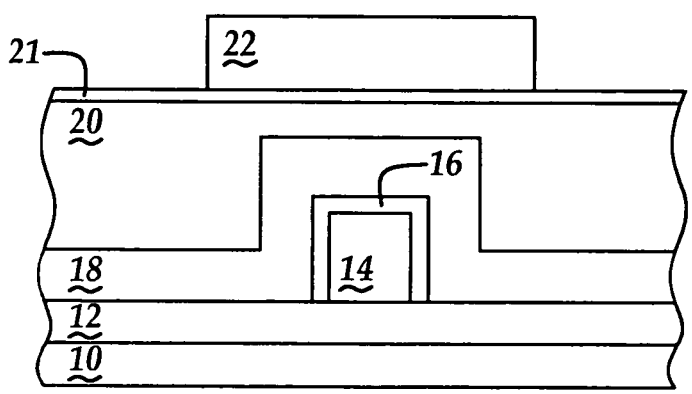

FIG. 4 shows a schematic cross-sectional diagram illustrating the results of further processing of the semiconductor product of FIG. 3.

FIG. 4 shows a blanket planarizing layer 20 formed upon the blanket conformal topographic gate electrode material layer 18. FIG. 4 also shows a blanket second layer 21 formed upon the blanket planarizing layer 20. FIG. 4 finally also shows a patterned photoresist layer 22 formed upon the blanket second layer 21.

The blanket planarizing layer 20 may be formed from any of several materials that are employed within semiconductor product fabrication. Typically, the blanket planarizing layer 20 is formed of a dielectric material such as a silicon oxide dielectric material or a silicon oxynitride dielectric material. Typically, the blanket planarizing layer 20 is formed to a thickness of from about 1000 to about 10000 angstroms.

The blanket second layer 21 may be formed of an anti-reflective coating material, such as a silicon oxynitride material. Typically, the blanket second layer 21 is formed to a thickness of from about 200 to about 2000 angstroms.

Figure 5:
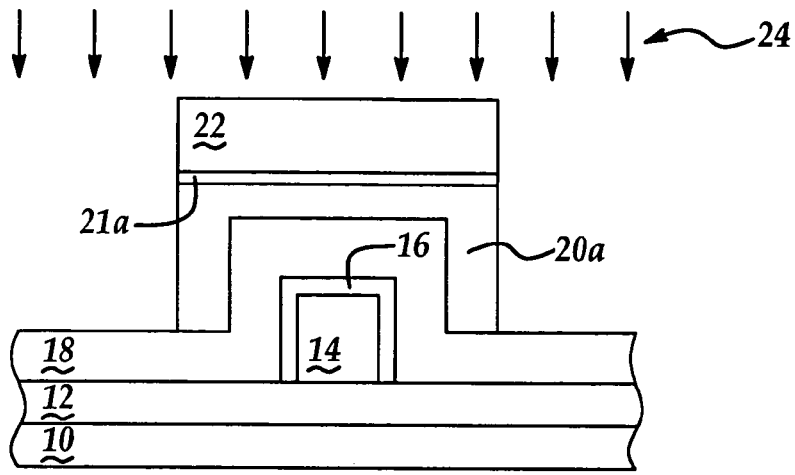

FIG. 5 shows a schematic cross-sectional diagram illustrating the results of further processing of the semiconductor product of FIG. 4.

FIG. 5 shows the results of etching the blanket second layer 21 and the blanket planarizing layer 20 to form a patterned second layer 21a and a patterned planarizing layer 20a, while employing a first etching plasma 24 in conjunction with the patterned photoresist layer 22 as a mask layer.

The first etching plasma 24 employs an etchant gas composition appropriate to the materials from which are formed the blanket second layer 21 and the blanket planarizing layer 20. Typically, the etchant gas composition includes a fluorine containing etchant gas when either or both of the blanket second layer 21 or the blanket planarizing layer 20 is formed of a silicon containing dielectric material.

Figure 6:
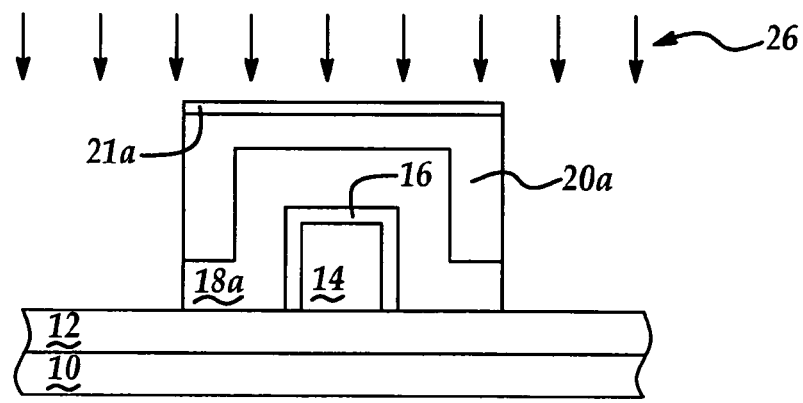

FIG. 6 shows the results of further processing of the semiconductor product of FIG. 5.

FIG. 6 shows the results of patterning the blanket conformal topographic gate electrode material layer 18 to form a gate electrode, while employing the patterned second layer 21a and the patterned planarizing layer 20a as a mask. The patterning is undertaken employing a second etching plasma 26.

When the blanket conformal topographic gate electrode material layer 18 is formed of a polysilicon material, the second etching plasma 26 typically employs a chlorine containing etchant gas composition.

The present invention provides value within the context of the foregoing two step etching method since the blanket planarizing layer 20 provides a planar surface upon which is indirectly formed the patterned photoresist layer 22. Thus, the patterned photoresist layer 22 is formed from a corresponding blanket photoresist layer with enhanced resolution. In comparison with attempting to pattern the blanket conformal topographic gate electrode material layer 18 directly with a patterned photoresist layer, the gate electrode is formed with enhanced resolution.

Although not specifically illustrated within the preferred embodiment of the invention, the patterned second layer 21a and the patterned planarizing layer 20a may either remain or be removed incident to further processing of the semiconductor product of FIG. 6. As is illustrated within FIG. 6, the resultant FIN-FET structure provides an inverted "U" shaped gate electrode 18a nested within an inverted "U" shaped patterned planarizing layer 20a.

Figure 7:
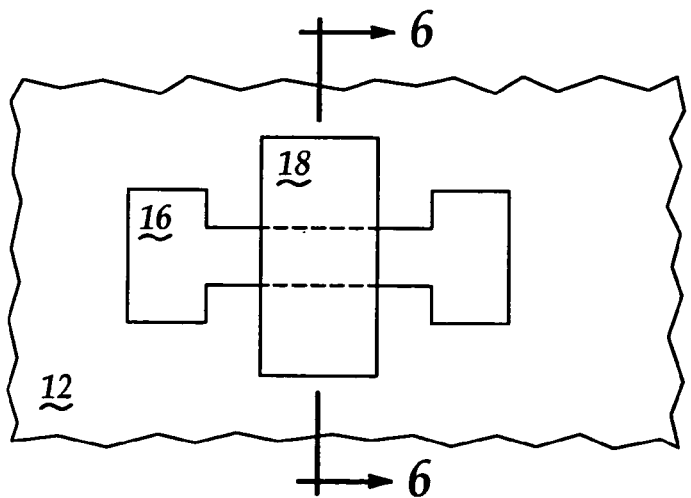
FIG. 7 shows a schematic plan-view diagram corresponding with the schematic cross-sectional diagram of FIG. 6.

FIG. 7 shows a schematic plan-view diagram corresponding with the schematic cross-sectional diagram of FIG. 7. FIG. 7 also corresponds generally with the schematic plan-view diagram of FIG. 1.

FIG. 7 shows the insulator layer 12. The gate dielectric layer 16 formed upon the patterned silicon source/drain and channel fin layer is formed upon the insulator layer 12. The gate electrode 18 is formed patterned over the channel region of the patterned silicon source/drain and channel fin layer.

FIG. 1 to FIG. 7 show a series of schematic plan-view and cross-sectional diagrams illustrating the results of progressive stages in fabricating a FIN-FET device in accord with a preferred embodiment of the invention. The FIN-FET device has a gate electrode that is formed with enhanced resolution since it is formed employing a patterned planarizing layer as a hard mask layer, rather than patterning to pattern a gate electrode from a blanket conformal topographic gate electrode material layer directly.

The preferred embodiment of the invention is illustrative of the invention rather than limiting of the invention. Revisions and modifications may be made to methods, materials, structures and dimensions for forming a FIN-FET device in accord with the preferred embodiment of the invention, while still forming a FIN-FET device in accord with the invention, further in accord with the accompanying claims.

What is claimed is:

1. A method for fabricating a FIN-FET device comprising:
   providing an insulator substrate;
   forming a patterned silicon source/drain and channel fin layer upon the insulator substrate;
   forming a gate dielectric layer upon the patterned silicon source/drain and channel fin layer;
   forming a blanket topographic gate electrode material layer upon the gate dielectric layer;
   then forming a blanket planarizing layer comprising a dielectric upon the blanket topographic gate electrode material layer;
   then patterning the blanket planarizing layer to form a patterned planarizing layer; and
   then patterning the blanket topographic gate electrode material layer to form a gate electrode while employing the patterned planarizing layer as a mask.

2. The method of claim 1 wherein the insulator substrate is derived from a silicon-on-insulator substrate.

3. The method of claim 1 wherein the patterned silicon source/drain and channel fin layer is formed from a monocrystalline silicon material.

4. The method of claim 1 wherein the gate dielectric layer is formed of a silicon oxide material.

5. The method of claim 1 wherein the blanket planarizing layer is formed of a silicon oxide material.

6. The method of claim 1 further comprising stripping the patterned planarizing layer from the gate electrode.

7. A method for fabricating a FIN-FET device comprising:
   providing an insulator substrate;
   forming a patterned silicon source/drain and channel fin layer upon the insulator substrate;
   forming a gate dielectric layer upon the patterned silicon source/drain and channel fin layer;
   forming a blanket topographic; gate electrode material layer upon the gate dielectric layer;
   forming a blanket planarizing layer upon the blanket topographic gate electrode material layer;
   forming a blanket second layer upon the blanket planarizing layer;
   patterning the blanket second layer and the blanket planarizing layer to term a patterned second layer and a patterned planarizing layer; and
   patterning the blanket topographic gate electrode material layer to form a gate electrode while employing the patterned planarizing layer as a mask.

8. The method of claim 7 wherein the insulator substrate as derived from a silicon-on-insulator substrate.

9. The method of claim 7 wherein the patterned silicon source/drain and channel fin layer is formed to a thickness of from about 500 to about 5000 angstroms.

10. The method of claim 7 wherein the gate dielectric layer is formed to a thickness of from about 10 to about 100 angstroms.

11. The method of claim 7 wherein the blanket planarizing layer is formed to a thickness of from about 1000 to about 10000 angstroms.

12. The method of claim 7 wherein the blanket second layer is formed to a thickness of from about 200 to about 2000 angstroms.

13. The method of claim 7 further comprising stripping the patterned planarizing layer from the gate electrode.

14. A method for fabricating a FIN-FET device comprising:
   providing an insulator substrate;
   forming a patterned semiconductor source/drain and channel fin layer upon the insulator substrate;
   forming a gate dielectric layer upon the patterned semiconductor source/drain and channel fin layer;
   forming a gate electrode material layer upon the gate dielectric layer;
   then forming a dielectric planarizing layer upon the gate electrode material layer;
   then forming a second dielectric layer upon the dielectric planarizing layer;
   then patterning the second dielectric layer and the dielectric planarizing layer to form a patterned second dielectric layer and a patterned dielectric planarizing layer; and
   then patterning the gate electrode material layer to form a gate electrode while employing the patterned dielectric planarizing layer as a mask.

15. The method of claim 14 wherein the insulator substrate is derived from a silicon-on-insulator substrate.

16. The method of claim 14 wherein tho patterned silicon source/drain and channel fin layer is formed to a thickness of from about 500 to about 5000 angstroms.

17. The method of claim 14 wherein the gate dielectric layer is formed to a thickness of from about 10 to about 100 angstroms.

18. The method of claim 14 wherein the dielectric planarizing layer is formed to thickness of from about 1000 to about 10000 angstroms.

19. The method of claim 14 wherein the second dielectric layer is formed to a thickness of from about 200 to about 2000 angstroms.

20. The method at claim 14 further comprising the step at stripping the patterned dielectric planarizing layer from the gate electrode.

* * * * *